United States Patent
Yen et al.

(10) Patent No.: US 10,483,389 B2
(45) Date of Patent: *Nov. 19, 2019

(54) SILICON CARBIDE SEMICONDUCTOR DEVICE

(71) Applicant: Hestia Power Inc., Hsinchu (TW)

(72) Inventors: Cheng-Tyng Yen, Hsinchu (TW);
Chien-Chung Hung, Hsinchu (TW);
Chwan-Ying Lee, Hsinchu (TW);
Lurng-Shehng Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/968,430

(22) Filed: Dec. 14, 2015

(65) Prior Publication Data
US 2016/0111533 A1  Apr. 21, 2016

Related U.S. Application Data

(63) Continuation-in-part of application No. 14/668,299, filed on Mar. 25, 2015, now Pat. No. 9,246,016.

(30) Foreign Application Priority Data

Jul. 2, 2014 (TW) .............................. 103122787 A

(51) Int. Cl.
| | | |
|---|---|---|
| *H01L 29/78* | (2006.01) | |
| *H01L 29/423* | (2006.01) | |
| *H01L 29/45* | (2006.01) | |
| *H01L 29/08* | (2006.01) | |
| *H01L 29/16* | (2006.01) | |
| *H01L 29/10* | (2006.01) | |
| *H01L 29/06* | (2006.01) | |

(52) U.S. Cl.
CPC ...... *H01L 29/7806* (2013.01); *H01L 29/0688* (2013.01); *H01L 29/0696* (2013.01); *H01L 29/1608* (2013.01); *H01L 29/1095* (2013.01); *H01L 29/45* (2013.01)

(58) Field of Classification Search
None
See application file for complete search history.

(56) References Cited

U.S. PATENT DOCUMENTS

| | | | | |
|---|---|---|---|---|
| 6,049,108 A | * | 4/2000 | Williams | ............ H01L 27/0255 257/341 |
| 6,621,107 B2 | | 9/2003 | Blanchard et al. | |
| 6,979,863 B2 | | 12/2005 | Ryu | |
| 7,151,280 B2 | * | 12/2006 | Hayashi | .................. H01L 29/47 257/183 |

(Continued)

*Primary Examiner* — Walter H Swanson
*Assistant Examiner* — Kien C Ly
(74) *Attorney, Agent, or Firm* — Muncy, Geissler, Olds & Lowe, P.C.

(57) ABSTRACT

A silicon carbide (SiC) semiconductor device having a metal oxide semiconductor field effect transistor (MOSFET) and integrated with an anti-parallelly connected Schottky diode includes: an n-type substrate, an n-type drift layer, a plurality of doped regions, a gate dielectric layer, a gate electrode, an inter-layer dielectric layer, a plurality of source openings, a plurality of junction openings, a plurality of gate openings, a first metal layer and a second metal layer. The second metal layer at the junction openings forms the Schottky diode.

23 Claims, 11 Drawing Sheets

(56) References Cited

U.S. PATENT DOCUMENTS

| | | | |
|---|---|---|---|
| 9,029,874 B2* | 5/2015 | Horikawa | H01L 21/8213 257/77 |
| 9,246,016 B1* | 1/2016 | Yen | H01L 29/8083 |
| 2004/0183080 A1 | 9/2004 | Kusumoto et al. | |
| 2006/0202264 A1 | 9/2006 | Bhalla et al. | |
| 2007/0023830 A1* | 2/2007 | Pfirsch | H01L 29/0634 257/341 |
| 2009/0218621 A1* | 9/2009 | Pfirsch | H01L 29/0634 257/342 |
| 2009/0283776 A1 | 11/2009 | Iwamuro | |
| 2010/0314659 A1* | 12/2010 | Yilmaz | H01L 21/26586 257/139 |
| 2012/0223339 A1* | 9/2012 | Mizukami | H01L 27/0727 257/77 |
| 2012/0286290 A1* | 11/2012 | Uchida | H01L 29/7828 257/77 |
| 2013/0248883 A1* | 9/2013 | Das | H01L 25/18 257/77 |
| 2013/0277688 A1* | 10/2013 | Nakano | H01L 21/046 257/77 |
| 2013/0313569 A1* | 11/2013 | Usagawa | H01L 29/78 257/77 |
| 2013/0313570 A1* | 11/2013 | Sdrulla | H01L 29/7806 257/77 |
| 2013/0313576 A1* | 11/2013 | Nakano | H01L 29/8611 257/77 |
| 2014/0175559 A1* | 6/2014 | Hung | H01L 29/7806 257/390 |
| 2014/0231828 A1* | 8/2014 | Horikawa | H01L 21/8213 257/77 |
| 2014/0299887 A1* | 10/2014 | Matocha | H01L 23/26 257/77 |
| 2014/0299890 A1* | 10/2014 | Matocha | H01L 29/1608 257/77 |
| 2014/0332858 A1* | 11/2014 | Chen | H01L 29/42316 257/268 |
| 2015/0001553 A1* | 1/2015 | Kudou | H01L 29/36 257/77 |
| 2015/0028351 A1* | 1/2015 | Van Brunt | H01L 29/1608 257/77 |
| 2015/0084063 A1* | 3/2015 | Van Brunt | H01L 29/66143 257/77 |
| 2015/0084066 A1* | 3/2015 | Banerjee | H01L 21/22 257/77 |
| 2015/0084119 A1* | 3/2015 | Pala | H01L 29/66712 257/329 |
| 2015/0084125 A1* | 3/2015 | Pala | H01L 29/7802 257/334 |
| 2015/0123148 A1* | 5/2015 | Nakano | H01L 29/7802 257/77 |
| 2015/0206967 A1* | 7/2015 | Hayashi | H01L 27/0255 257/77 |
| 2015/0236012 A1* | 8/2015 | Hino | H01L 27/0629 257/77 |
| 2015/0372092 A1* | 12/2015 | Yamamoto | H01L 21/049 257/77 |
| 2016/0163800 A1* | 6/2016 | Sakai | H01L 29/0657 257/77 |

* cited by examiner

SILICON CARBIDE SEMICONDUCTOR DEVICE

This application is a continuation-in-part, and claims priority, of from U.S. patent application Ser. No. 14/668,299 filed on Mar. 25, 2015, entitled "SILICON CARBIDE SEMICONDUCTOR DEVICE".

FIELD OF THE INVENTION

The present invention relates to a semiconductor power device, and particularly to a silicon carbide (SiC) semiconductor power device.

BACKGROUND OF THE INVENTION

Power semiconductor devices should provide the minimum possible turn-on resistance, reverse leakage current and high switching speed at the rated breakdown voltage, to reduce the operational conduction loss and switching loss. The wide bandgap ($E_g$=3.26 eV), high threshold field of dielectric breakdown(2.2 MV/cm) and high thermal conductivity (4.9 W/cm-K) of silicon carbide (SiC) make it an ideal material for power switching devices. The thickness of voltage supporting layer (a low doping concentration drift layer) of power devices made of SiC is one-tenth of that made of silicon at the same rated blocking voltage, and the theoretical conduction resistance of SiC power devices can be hundreds times lower than Si power devices.

However, the wide bandgap of SiC also makes the turn-on voltage of body diode of SiC metal oxide semiconductor field effect transistor (MOSFET) reach to nearly 3V, which will result in a larger loss during switching and limit the switching speed. Furthermore, the basal plane dislocations in SiC drift layer will expand into stacking faults due to recombination of carriers during the forward conducting of body diode. SiC MOSFET's may degrade or even fail due to these stacking faults. Therefore, a SiC MOSFET sometimes co-packages an anti-parallelly connected SiC Schottky diode externally to increase the operating speed, reduce switching loss and avoid reliability issues brought by stacking faults.

In addition to externally connected with a Schottky diode, U.S. Pat. No. 6,979,863 discloses a SiC MOSFET integrated with a Schottky diode. In the SiC MOSFET of the above disclosure, the source metal and the Schottky metal are adjacent to each other which require additional layers in the manufacturing process to individually fabricate source contacts and Schottky contacts. Besides, to prevent the source metal erroneously contact to the drift layer and thus cause leakage current of the SiC MOSFET, greater tolerances in design rules need to be reserved to avoid yield loss. Thus, an effective gate width per unit area of the SiC MOSFET and a current density of the device may be undesirably affected, with costs further increased.

SUMMARY OF THE INVENTION

It is a primary object of the present invention to provide a SiC MOSTFET device, which is integrated with a Schottky diode without involving an additional mask and provides preferred utilization efficiency.

To achieve the above object, a silicon carbide (SiC) semiconductor device is provided. The SiC semiconductor device comprises:

an n-type substrate, having a first doping concentration;

an n-type drift layer, disposed on the substrate, having a second doping concentration less than the first doping concentration;

a plurality of doped regions, disposed at the n-type drift layer, spaced from each other and formed a junction field effect transistor (JFET) region having a third doping concentration therebetween, each of the doped regions comprising a p-well, a heavily doped n-type (n+) region located in the p-well, and a heavily doped p-type (p+) region;

a gate dielectric layer, disposed on the n-type drift layer;

a gate electrode, disposed on the gate dielectric layer;

an inter-layer dielectric layer, disposed on the gate dielectric layer and the gate electrode;

a plurality of source openings, penetrating through the inter-layer dielectric layer and the gate dielectric layer to a surface portion of the n+ region and the p+ region and are separated by the gate electrode and the inter-layer dielectric layer;

a plurality of junction openings, penetrating through the inter-layer dielectric layer and the gate dielectric layer to a surface portion of the JFET region and the doped regions are separated by the gate electrode and the inter-layer dielectric layer;

a plurality of gate openings, penetrating through the inter-layer dielectric layer to a surface portion of the gate electrode;

a first metal layer, disposed at a bottom of the source openings, formed an Ohmic contact with the surface portion of the n+ region and the p+ region; and a second metal layer, comprising a first portion and a second portion, wherein the first portion covers the source openings and the junction openings is electrically connected to the first metal layer and forms a Schottky contact with the surface portion of the JFET region, the second portion covers the gate openings and is electrically insulated from the first portion.

To achieve the above object, a silicon carbide (SiC) semiconductor device is further provided. The SiC semiconductor device comprises:

an n-type substrate, having a first doping concentration;

an n-type drift layer, disposed on the substrate, having a second doping concentration less than the first doping concentration;

a plurality of first doped regions and a plurality of second doped regions, disposed at the n-type drift layer, each of the first doped regions comprising a first p-well, a heavily doped n-type (n+) region located in the first p-well, and a first heavily doped p-type (p+) region located in the first p-well and surrounded by the n+ region, each of the second doped regions comprising at least one sub-doped region, wherein a first junction field effect transistor (JFET) region having a third doping concentration formed between each of the first doped regions and the second doped regions and a second junction field effect transistor (JFET) region having a forth doping concentration formed between each of the sub-doped regions or enclosed by the sub-doped region;

a gate dielectric layer, disposed on the n-type drift layer;

a gate electrode, disposed on the gate dielectric layer;

an inter-layer dielectric layer, disposed on the gate dielectric layer and the gate electrode;

a plurality of source openings, penetrating through the inter-layer dielectric layer and the gate dielectric layer to a surface portion of the n+ region and the first p+ region and are separated by the gate electrode and the inter-layer dielectric layer;

a plurality of junction openings, penetrating through the inter-layer dielectric layer and the gate dielectric layer to a surface portion of the second JFET region and the second doped regions are separated by the gate electrode and the inter-layer dielectric layer;

a plurality of gate openings, penetrating through the inter-layer dielectric layer to a surface portion of the gate electrode;

a first metal layer, disposed at a bottom of the source openings, formed an Ohmic contact with the surface portion of the n+ region and the first p+ region; and a second metal layer, comprising a first portion and a second portion, wherein the first portion covers the source openings and the junction openings is electrically connected to the first metal layer and forms a Schottky contact with the surface portion of the second JFET region, the second portion covers the gate openings and is electrically insulated from the first portion.

Thus, in the present invention, the source openings and the junction openings are separately arranged. Further, the first metal layer is formed at the bottom the source openings to form an Ohmic contact with only the n+ region and the p+ region (or the first p+ region). As such, shorting between the lightly doped n-type drift layer and the first metal layer due to manufacturing variations can be avoided, thereby improving manufacturing yield.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
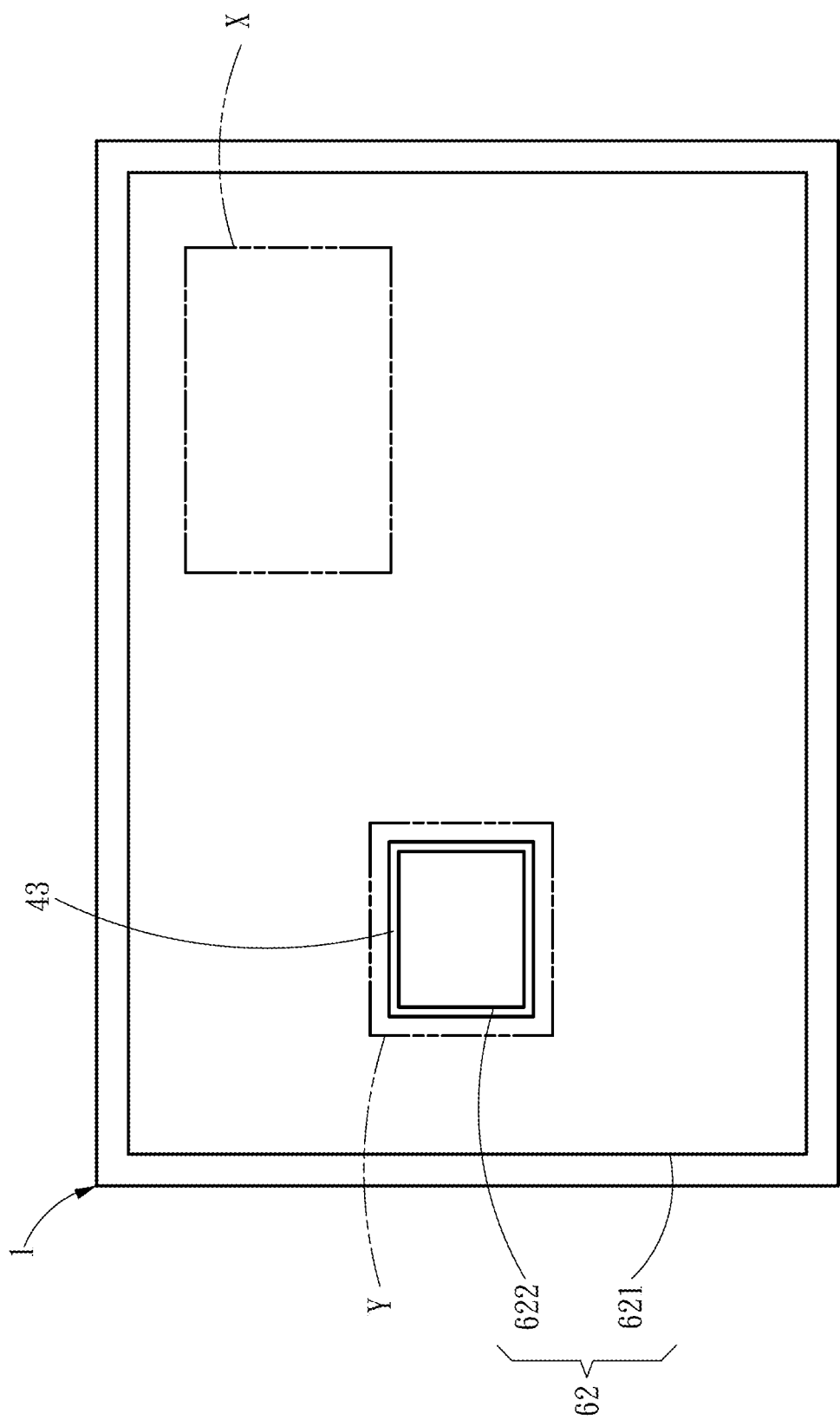
FIG. 1 is a top view of the present invention.
Figure 2A:
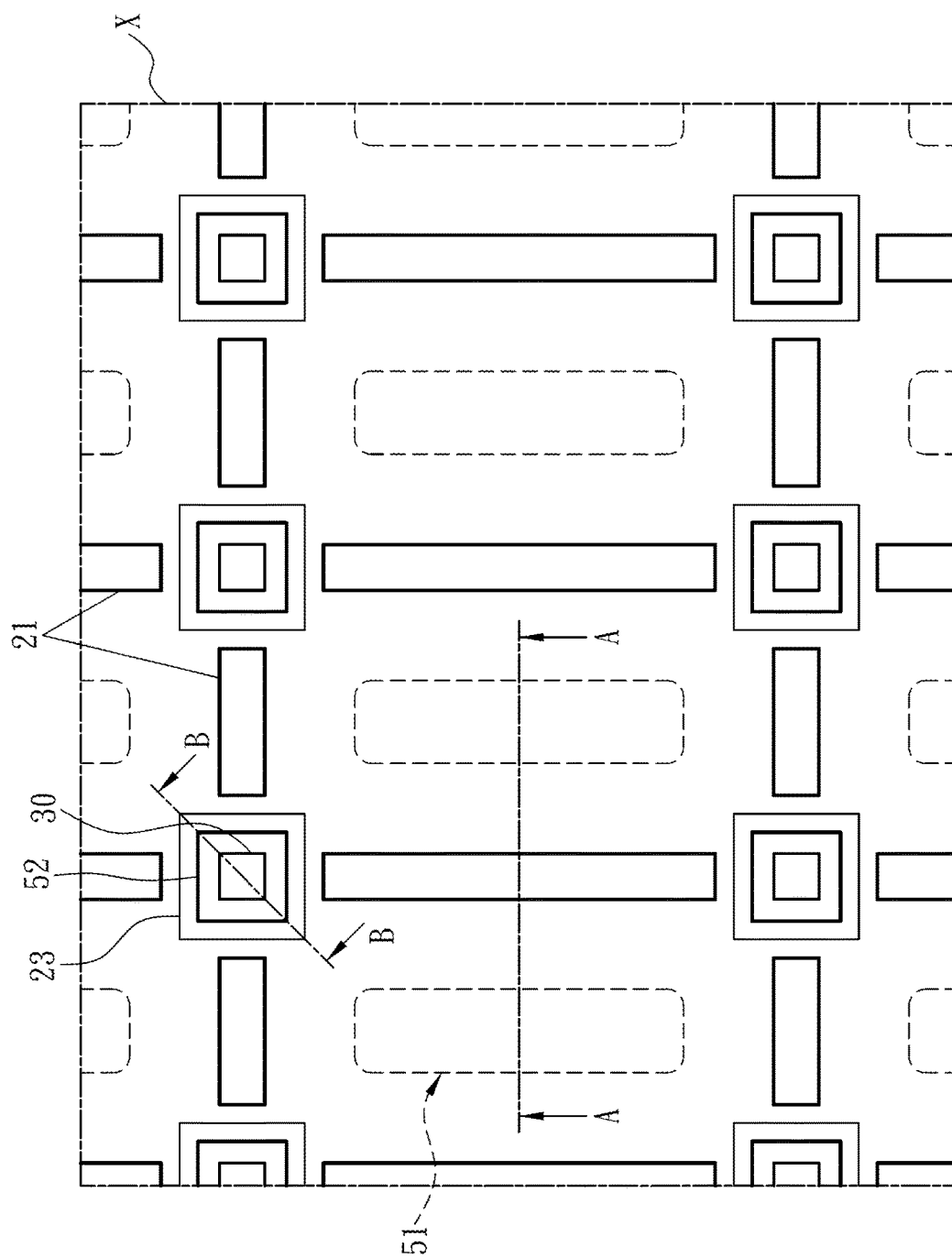
FIG. 2A is an enlarged view of an area X in FIG. 1 according to a first embodiment of the present invention.
Figure 2B:
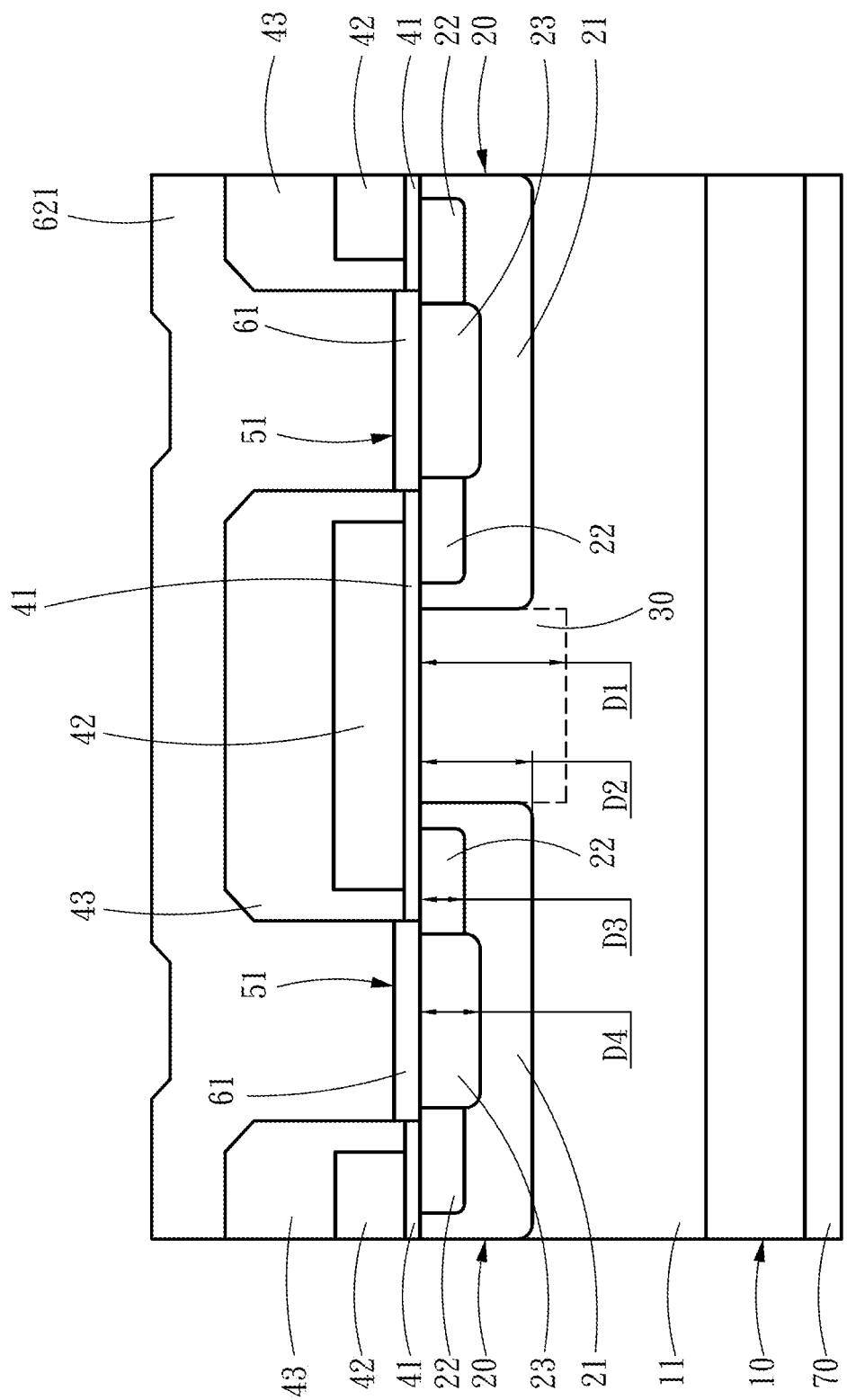
FIG. 2B is a sectional view along A-A of FIG. 2A.
Figure 2C:
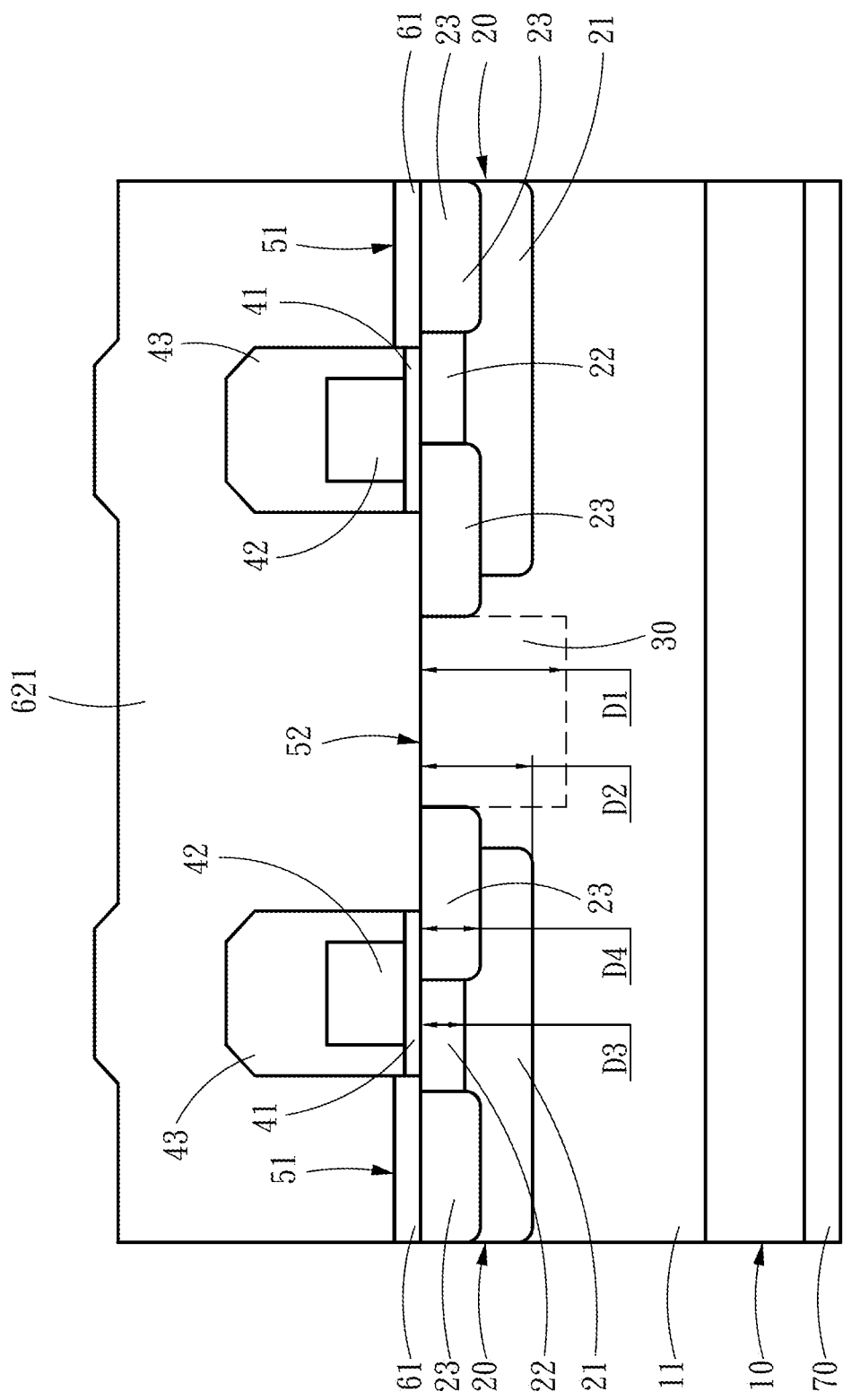
FIG. 2C is a sectional view along B-B of FIG. 2A.
Figure 3A:
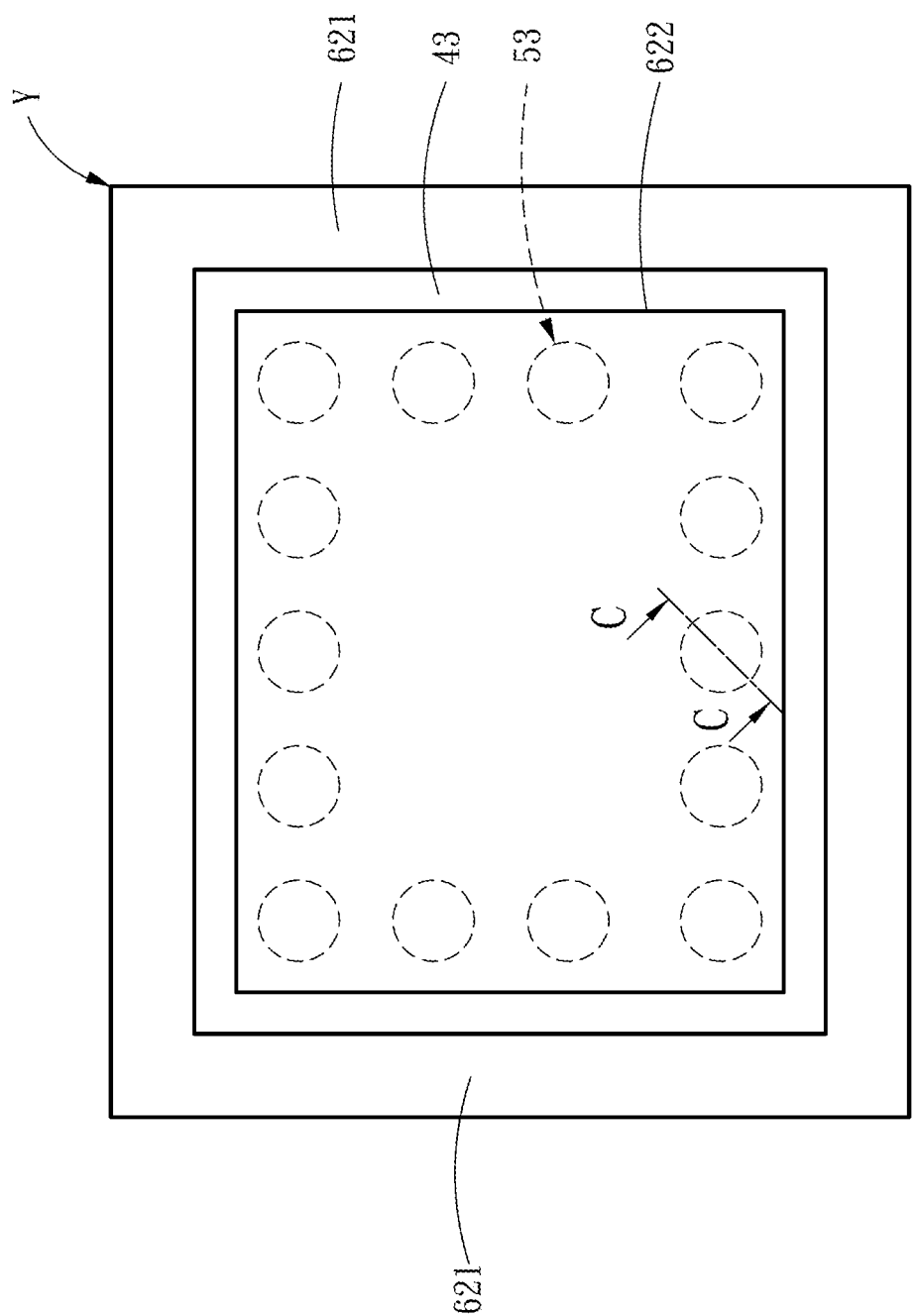
FIG. 3A is an enlarged view of an area Y in FIG. 1 according to the first embodiment of the present invention.
Figure 3B:
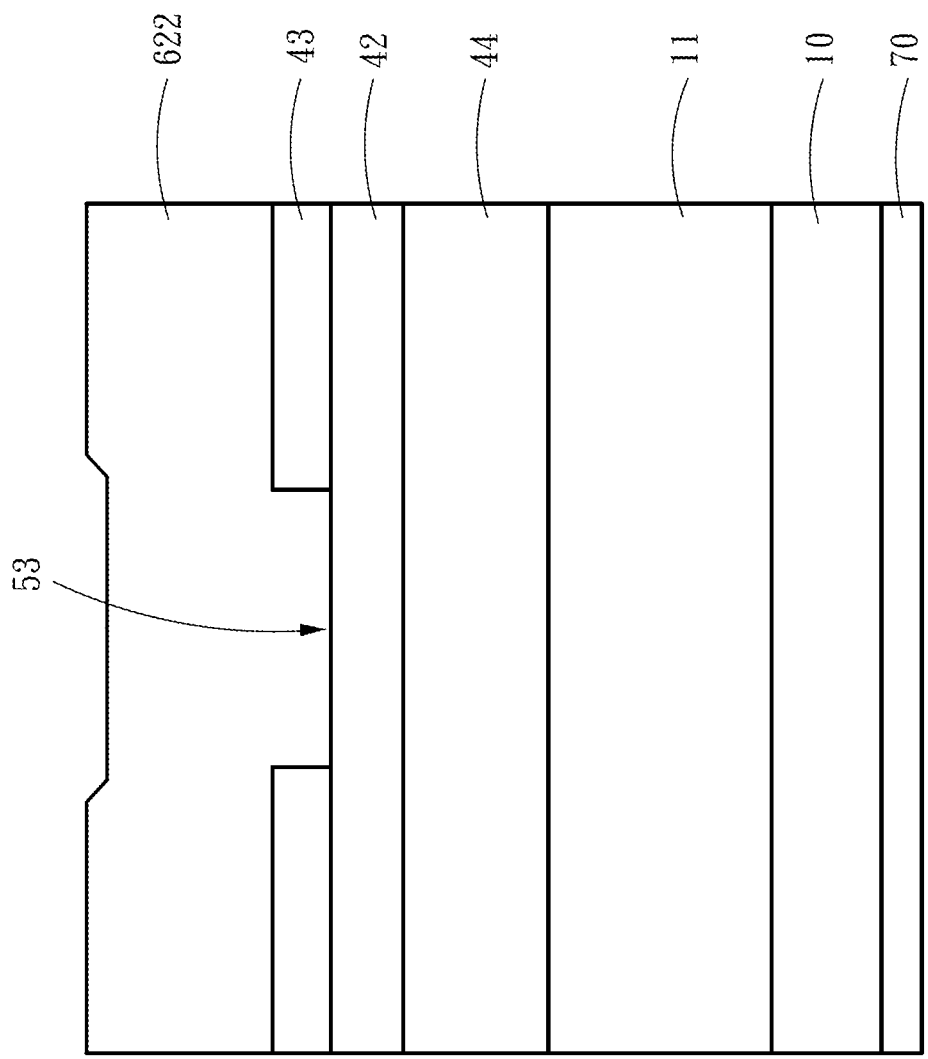
FIG. 3B is a sectional view along C-C of FIG. 3A.

FIG. 1 shows a top view of the present invention. FIG. 2A shows an enlarged view of an area X in FIG. 1 according to a first embodiment of the present invention. FIG. 2B shows a sectional view along A-A of FIG. 2A. FIG. 2C shows a sectional view along B-B of FIG. 2A. FIG. 3B shows an enlarged view of an area Y in FIG. 1. FIG. 3B shows a sectional view along C-C of FIG. 3A. Referring to FIG. 1, FIGS. 2A to 2C, and FIGS. 3A and 3B, a SiC semiconductor device 1 of the present invention includes an n-type substrate 10, an n-type drift layer 11, a plurality of doped regions 20, a gate dielectric layer 41, a gate electrode 42, an inter-layer dielectric layer 43, a plurality of source openings 51, a plurality of junction openings 52, a plurality of gate openings 53, a first metal layer 61, and a second metal layer 62.

Figure 2D:
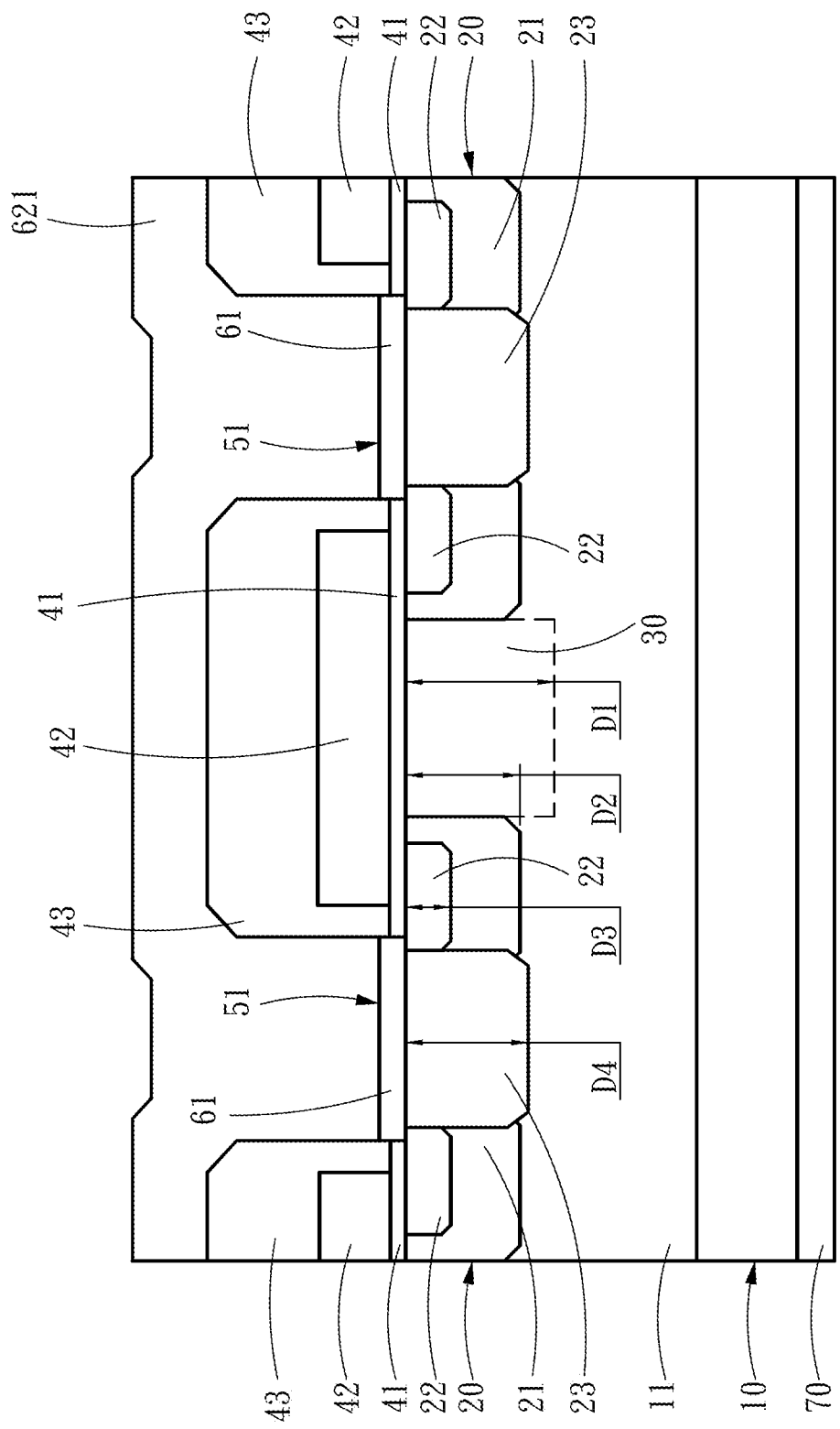
FIG. 2D is a sectional view along A-A of FIG. 2A according to another embodiment of the present invention.

Referring to FIG. 2B, the n-type substrate 10 is a 4H-SiC substrate, and is heavily doped with a first doping concentration. The n-type drift layer 11 is arranged on the substrate 10, and is doped with a second doping concentration less than the first doping concentration. In this embodiment, the first doping concentration is greater than $1E18$ $cm^{-3}$ and the second doping concentration is between $1E14$ $cm^{-3}$ and $1E17$ $cm^{-3}$. The doped regions 20 are disposed at an interval at the n-type drift layer 11, and each includes a p-well 21, a heavily doped n-type (n+) region 22, and a heavily doped p-type (p+) region 23. The p-well 21 has a doping concentration smaller than $1E19$ $cm^{-3}$. The n+ region 23 has a doping concentration greater than $1E19$ $cm^{-3}$, and is disposed in the p-well 21. The p+ region 23 has a doping concentration greater than $1E19$ $cm^{-3}$, and is surrounded by the n+ region 22 and is in contact with the p-well 21. In the embodiment, phosphorous or nitrogen may be implanted as the n-type dopant, and aluminum or boron may be implanted as the p-type dopant, with implantation energy between 10 keV and 1400 keV. In another embodiment, as shown in FIG. 2D, the p+ region 23 is surrounded by the p-well 21 and the n+ region 22, and a part or all of the p+ region 23 overlaps with the p-well 21.

Again referring to FIG. 2B, a junction field effect transistor (JFET) region 30 is formed between the doped regions 20. The JFET region 30 has a third doping concentration greater than the second doping concentration of the n-type drift layer 11. The gate dielectric layer 41 is disposed on the n-type drift layer 11, and may be made of a material such as $SiO_2$, nitride-containing $SiO_2$ or $Al_2O_3$ by thermal oxidation, chemical vapor deposition (CVD) or atomic layer deposition (ALD). The gate electrode 42 is disposed on the gate dielectric layer 41, and corresponds above the JFET region 30. The gate electrode 42 may be made of a material such as heavily doped n-type poly-Si with phosphorous as a dopant, or a heavily doped p-type poly-Si with boron as a dopant. The inter-layer dielectric layer 43 is disposed on the gate dielectric layer 41 and the gate electrode 42, and is made of a material such as tetra-ethyl-ortho-silicate (TEOS), boro-phospho-silicate-glass (BPSG), oxynitride, undoped silicate glass (USG) or silicon rich nitride (SRN).

In the embodiment of the present invention, the JFET region 30 has a first depth D1, the p-well 21 has a second depth D2, the n+ region 22 has a third depth D3 and the p+ region 23 has a fourth depth D4. In the embodiment, the second depth D2 is greater than the third depth D3, the first depth D1 is greater than or equal to the second depth D2 and the first depth D1 is greater than or equal to the fourth depth D4.

The source openings 51 are formed by etching, and penetrate through the inter-layer dielectric layer 43 and the gate dielectric layer 41 to a surface portion of the n+ region 22 and the p+ region 23. The source openings 51 are separated by the gate electrode 42 and the inter-layer dielectric layer 43. Referring to FIG. 2C, the junction openings 52 are similarly formed by etching, and penetrate through the inter-layer dielectric layer 43 and the gate dielectric layer 41 to a surface portion of the JFET region 30 and the doped region 20. The junction openings 52 are separated by the gate electrode 42 and the inter-layer dielectric layer 43. Referring to FIGS. 3A and 3B, the gate openings 53 penetrate through the inter-layer dielectric layer 43 to a surface portion of the gate electrode 42. In the embodiment, the gate openings 53 are also formed by etching A field oxide layer 44 is further provided between the gate electrode 42 and the n-type drift layer 11.

The first metal layer 61 is disposed at a bottom of the source openings 51, and is a silicide or a combination of silicides of a material selected from a group consisting of nickel, titanium and aluminum. A metal is acted with SiC at an annealing temperature higher than 900° C. to form silicides. The unreacted materials are then removed by wet processes to have the first metal layer 61 remained at the bottom of the source openings 51. At the bottom of the source openings 51, the first metal layer 61 forms an Ohmic contact with the surface portion of the n+ region 22 and the p+ region 23. The second metal layer 62 may be made of a material such as titanium, molybdenum, nickel, aluminum, titanium silicide, molybdenum silicide, nickel silicide, aluminum silicide, titanium nitride, an aluminum copper alloy or an aluminum silicon copper alloy by PVD or CVD. The second metal layer 62 includes a first portion 621 and a second portion 622. The first portion 621 covers the junction openings 52 and the source openings 51, is in contact and electrically connected with the first metal layer 61 in the source openings 51, and forms a Schottky contact with the surface portion of the JFET region 30 in the junction openings 52. The second portion 622 covers the gate openings 53, and is not in contact with and electrically insulated from the first portion 621.

In one embodiment, the SiC semiconductor device 1 further includes a drain 70. The drain 70 is disposed at one side of the substrate 10 opposite to the n-drift layer 11. Accordingly, the SiC semiconductor device 1 forms a MOSFET integrated with an anti-parallelly connected junction barrier controlled Schottky rectifier.

As shown in FIG. 2A, in the first embodiment, for example, the SiC semiconductor device 1 is a design with a quadrilateral doped region 20 with a quadrilateral junction openings 52 formed at the center region to form a unit cell. In addition to the above shape, the unit cell may have a planar contour of a square, a hexagon or a long strip. In addition to the exemplary planar contour of a rectangle, the planar contour of the junction openings 52 may be a triangle, a hexagon, an octagon, a circle or a long strip, and may have a design adjustable according to the actual area of the device.

Figure 4A:
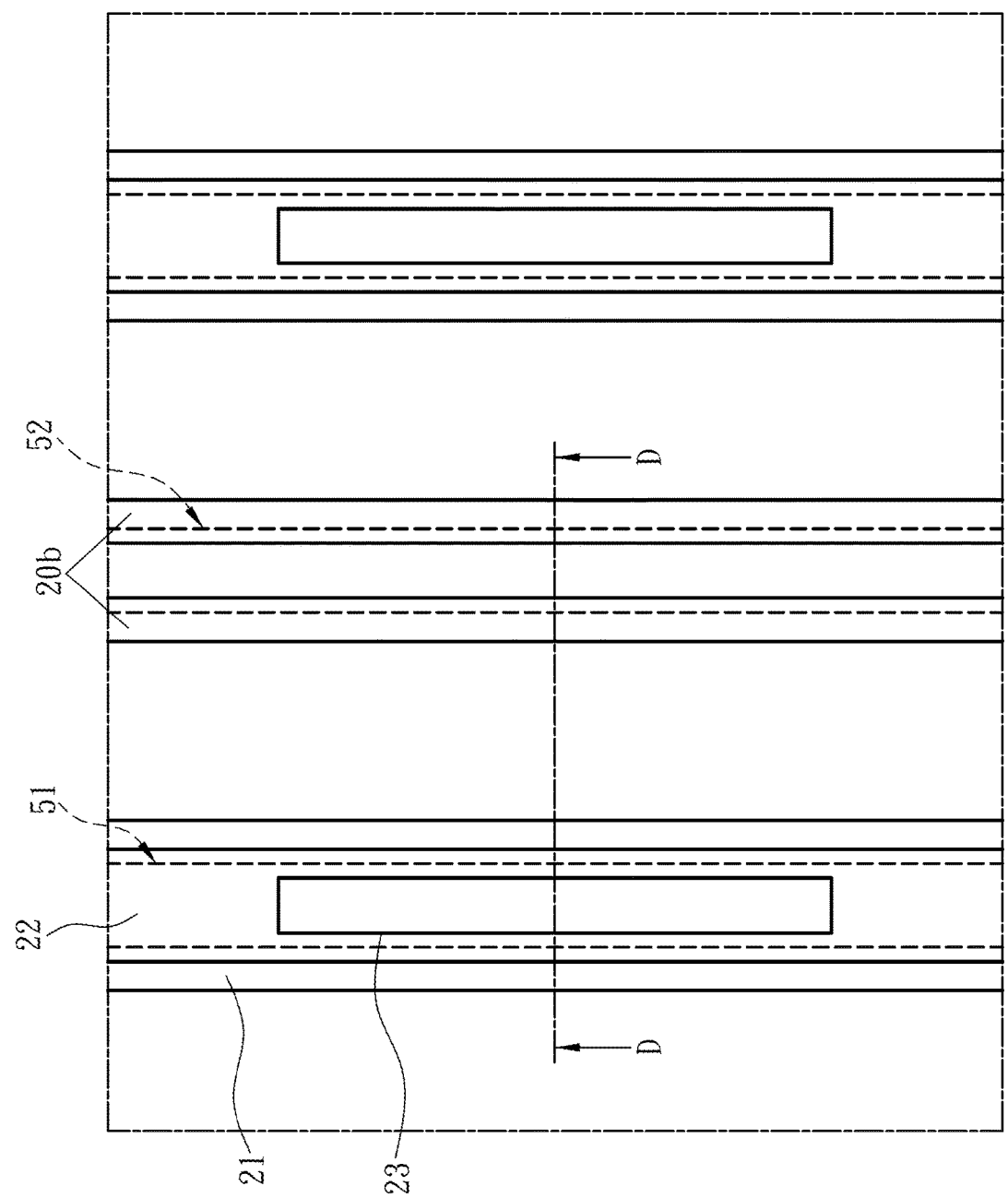
FIG. 4A is an enlarged view of the area X in FIG. 1 according to a second embodiment of the present invention.
Figure 4B:
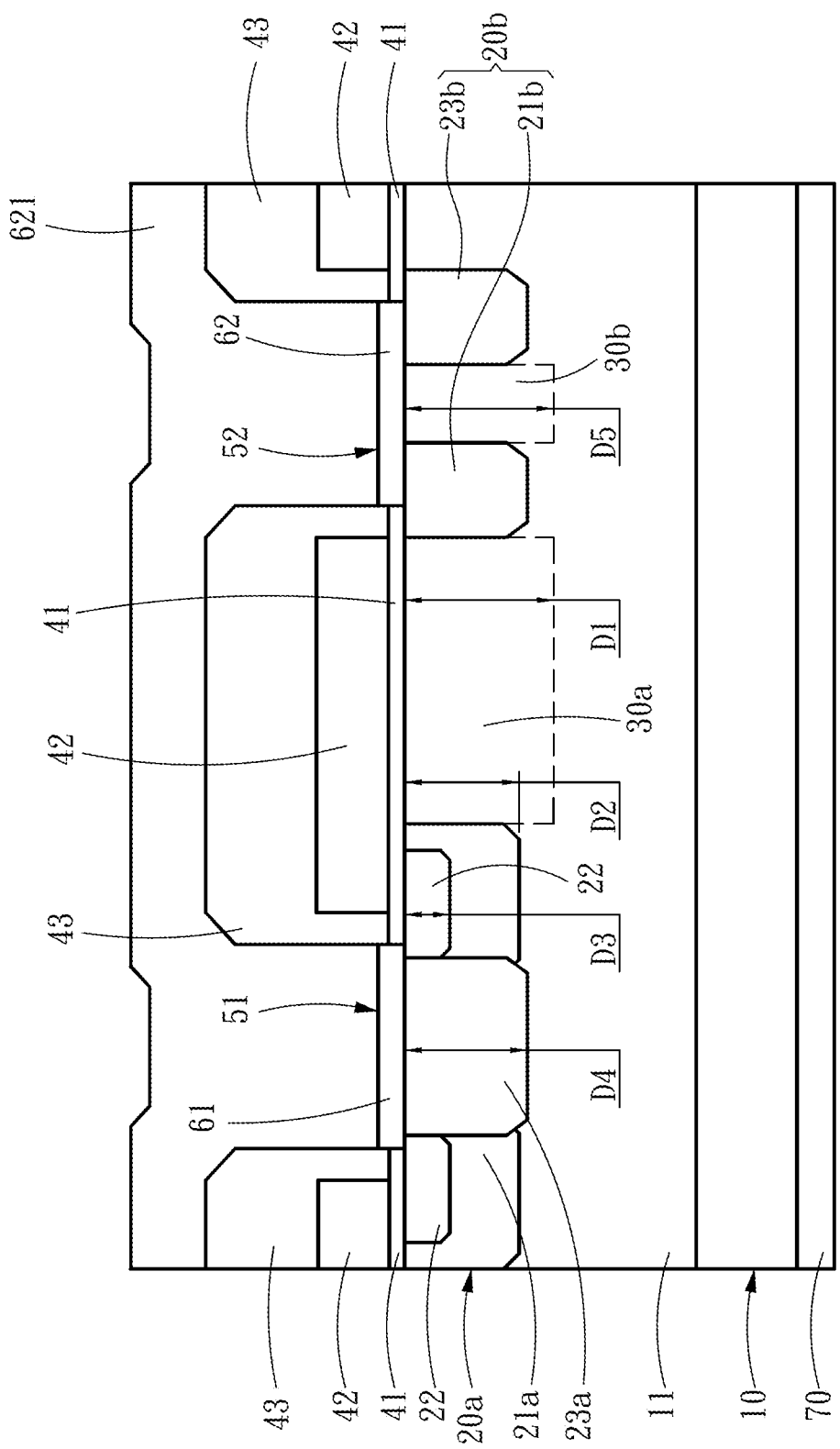
FIG. 4B is a sectional view along D-D of FIG. 4A.
Figure 4C:
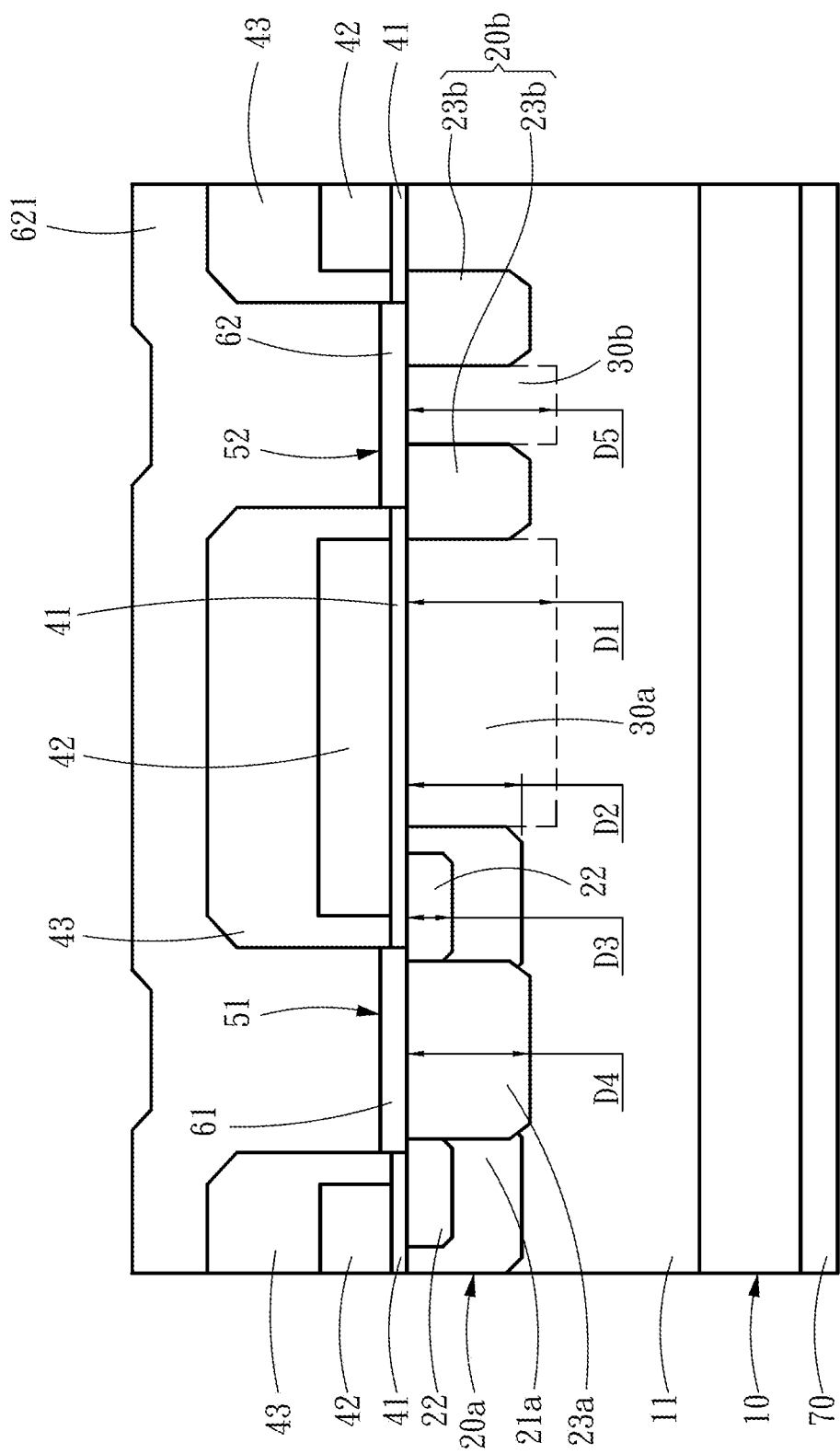
FIG. 4C is a sectional view along D-D of FIG. 4A according to another embodiment of the present invention.
Figure 4D:
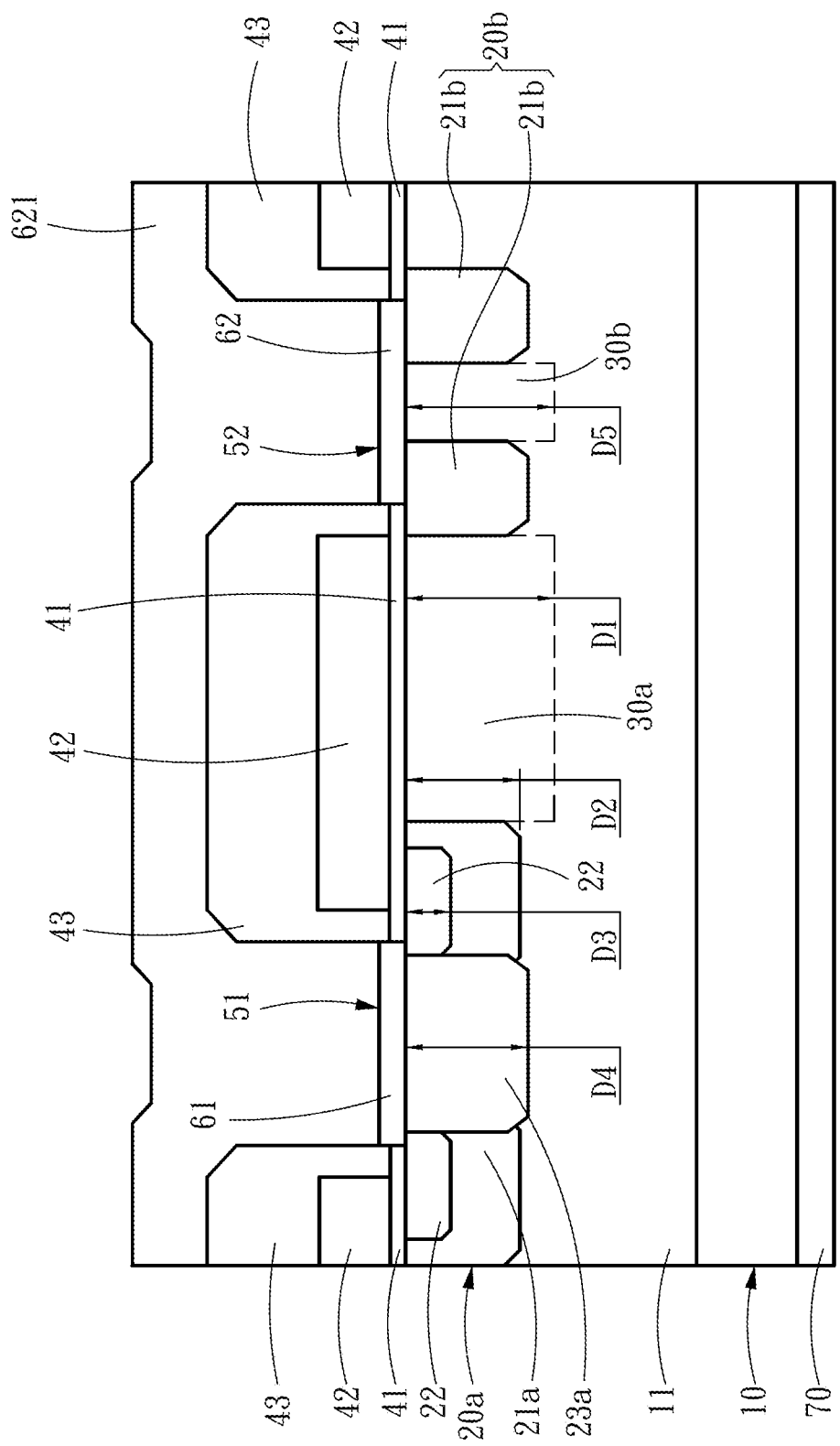
FIG. 4D is a sectional view along D-D of FIG. 4A according to a further embodiment of the present invention.

FIG. 4A shows an enlarged view of the area X in FIG. 1 according to another embodiment of the present invention. FIG. 4B is a sectional view along D-D of FIG. 4A. The main difference with the first embodiment is that in the second embodiment the unit cell has a planar contour of a long strip. Besides, the doped regions are divided into a plurality of first doped regions 20a and a plurality of second doped regions 20b. Both the first doped regions 20a and the plurality of second doped regions 20b are disposed at the n-type drift layer 11. Each of the first doped regions 20a comprises a first p-well 21a, a heavily doped n-type (n+) region 22 located in the first p-well 21a, and a first heavily doped p-type (p+) region 23a located in the first p-well 21a and surrounded by the n+ region 22. And each of the second doped regions 20b comprises at least one sub-doped region. A first junction field effect transistor (JFET) region 30a having a third doping concentration is formed between each of the first doped regions 20a and the second doped regions 20b and a second junction field effect transistor (JFET) region 30b having a forth doping concentration is formed between each of the sub-doped regions or enclosed by the sub-doped region. The sub-doped region may be a second p-well 21b, a second heavily doped p-type (p+) region 23b or the combination thereof In one embodiment of the present invention, the second doped regions 20b comprises two sub-doped regions and the sub-doped regions are consisted of a second p-well 21b and a second heavily doped p-type (p+) region 23b, as shown in FIG. 4B. In another embodiment of the present invention, the sub-doped regions are consisted of two second heavily doped p+ regions 23b, as shown in FIG. 4C. In a further embodiment of the present invention, the sub-doped regions are consisted of two second p-wells 21b, as shown in FIG. 4D. In the above embodiments, the second JFET region 30b is formed between each of the sub-doped regions. In other embodiment of the present invention, however, the second doped regions may comprise the single sub-doped region and the second JFET region 30b is formed enclosed by the sub-doped region.

In the embodiment of the present invention, the first JFET region 30a has a first depth D1, the first p-well 21a and the second p-well 21b have a second depth D2, the n+ region 22 has a third depth D3, the first p+ region 23a and a second 23b have a fourth depth D5. In the embodiment, the second depth D2 is greater than the third depth D3, the first depth D1 is greater than or equal to the second depth D2 and the first depth D1 is greater than or equal to the fourth depth D4. The second JFET region 30b may has a fifth depth D5 same or different with the first depth D1.

In the present invention, a planar contour of the source openings 51 and the junction openings 52 may be a quadrilateral, a hexagon, an octagon, a circle, a long stripe or the combination thereof And a planar contour of the p-well 21, the first p-well 21a and the sub-doped region may be a square, a rectangle, a hexagon, a long stripe or the combination thereof.

In conclusion, in the present invention, the source openings and the junction openings are separately disposed. In the manufacturing process, the source openings are first manufactured and the first metal layer is formed, and the gate openings and the junction openings are manufactured, followed by forming the second metal layer, thereby forming a good Schottky contact by the second metal layer at the junction openings with SiC. Further, the first metal layer is formed at the bottom of the source openings to form an Ohmic contact with only the n+ region and the p+ region (or the first p+ region). As such, shorting between the lightly doped n-type drift layer and the first metal layer due to manufacturing variations can be avoided, thereby improving manufacturing yield.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A silicon carbide (SiC) semiconductor device, comprising:
   an n-type substrate, having a first doping concentration;
   an n-type drift layer, disposed on the n-type substrate, having a second doping concentration less than the first doping concentration;
   a plurality of doped regions, disposed at the n-type drift layer, spaced from each other and formed a plurality of junction field effect transistor (JFET) regions, each of the JFET regions having a third doping concentration therebetween, each of the doped regions comprising a p-well, a heavily doped n-type (n+) region located in the p-well, and a heavily doped p-type (p+) region;
a gate dielectric layer, disposed on the n-type drift layer;
a gate electrode, disposed on the gate dielectric layer;
an inter-layer dielectric layer, disposed on the gate dielectric layer and the gate electrode;
a plurality of source openings, penetrating through the inter-layer dielectric layer and the gate dielectric layer to a surface portion of the heavily doped n+ region and the heavily doped p+ region, and the plurality of source openings are separated by the gate electrode and the inter-layer dielectric layer, wherein a top surface of n-type drift layer and a top surface of the heavily doped p+ region are in a same first plane;
a plurality of junction openings, penetrating through the inter-layer dielectric layer and the gate dielectric layer to a surface portion of the plurality of JFET regions and the doped regions, and the plurality of junction openings are separated by the gate electrode and the inter-layer dielectric layer;
a plurality of gate openings, penetrating through the inter-layer dielectric layer to a surface portion of the gate electrode;
a first metal layer, disposed only at a bottom of the source openings, formed an Ohmic contact with the surface portion of the heavily doped n+ region and the heavily doped p+ region;
a second metal layer, comprising a first portion and a second portion, wherein the first portion covers the source openings and the junction openings, is electrically connected to the first metal layer, and forms a Schottky contact with the surface portion of the plurality of JFET regions, the second portion covers the gate openings and is electrically insulated from the first portion, wherein a bottom surface of the first metal layer and a bottom surface of a part of the second metal layer are in a same second plane; and
wherein the third doping concentration is greater than the second doping concentration.

2. The SiC semiconductor device of claim 1, wherein the plurality of JFET regions having a first depth, the p-well having a second depth, the heavily doped n+ region having a third depth, the heavily doped p+ regions having a fourth depth, wherein the second depth is greater than the third depth.

3. The SiC semiconductor device of claim 2, wherein the first depth is greater than or equal to the second depth.

4. The SiC semiconductor device of claim 2, wherein the first depth is greater than or equal to the fourth depth.

5. The SiC semiconductor device of claim 1, wherein the heavily doped p+ region is surrounded by the p-well and the heavily doped n+ region, and at least a portion of the heavily doped p+ region overlaps with the p-well.

6. The SiC semiconductor device of claim 1, wherein the substrate is a 4H-SiC substrate.

7. The SiC semiconductor device of claim 1, wherein the first metal layer comprising a silicide or a combination of silicides of a material selected from a group consisting of nickel, titanium, aluminum, molybdenum and niobium.

8. The SiC semiconductor device of claim 1, wherein the second metal layer is selected from a group or a combination consisting of titanium, molybdenum, nickel, aluminum, titanium silicide, molybdenum silicide, nickel silicide, aluminum silicide, titanium nitride, an aluminum copper alloy and an aluminum silicon copper alloy.

9. The SiC semiconductor device of claim 1, wherein a planar contour of the p-well is selected from a group consisting of a square, a rectangle, a hexagon and a long stripe.

10. The SiC semiconductor device of claim 1, wherein a planar contour of the source openings is selected from a group consisting of a quadrilateral, a hexagon, an octagon, a circle and a long stripe.

11. The SiC semiconductor device of claim 1, wherein a planar contour of the junction openings is selected from a group consisting of a quadrilateral, a hexagon, an octagon, a circle and a long stripe.

12. A silicon carbide (SiC) semiconductor device, comprising:
an n-type substrate, having a first doping concentration;
an n-type drift layer, disposed on the substrate, having a second doping concentration less than the first doping concentration;
a plurality of first doped regions and a plurality of second doped regions, disposed at the n-type drift layer, each of the first doped regions comprising a first p-well, a heavily doped n-type (n+) region located in the first p-well, and a first heavily doped p-type (p+) region located in the first p-well and surrounded by the heavily doped n+ region, each of the second doped regions comprising at least one sub-doped region, wherein each of a plurality of first junction field effect transistor (JFET) regions having a third doping concentration formed between each of the first doped regions and the second doped regions, and each of a plurality of second junction field effect transistor (JFET) regions having a fourth doping concentration formed between each of the sub-doped regions or enclosed by the sub-doped region;
a gate dielectric layer, disposed on the n-type drift layer;
a gate electrode, disposed on the gate dielectric layer;
an inter-layer dielectric layer, disposed on the gate dielectric layer and the gate electrode;
a plurality of source openings, penetrating through the inter-layer dielectric layer and the gate dielectric layer to a surface portion of the heavily doped n+ region and the first heavily doped p+ region, and the plurality of source openings are separated by the gate electrode and the inter-layer dielectric layer, wherein a top surface of n-type drift layer and a top surface of the heavily doped p+ region are in a same first plane;
a plurality of junction openings, penetrating through the inter-layer dielectric layer and the gate dielectric layer to a surface portion of the plurality of second JFET regions and the second doped regions, and the plurality of junction openings are separated by the gate electrode and the inter-layer dielectric layer;
a plurality of gate openings, penetrating through the inter-layer dielectric layer to a surface portion of the gate electrode;
a first metal layer, disposed only at a bottom of the source openings, formed an Ohmic contact with the surface portion of the heavily doped n+region and the first heavily doped p+ region;
a second metal layer, comprising a first portion and a second portion, wherein the first portion covers the source openings and the junction openings, is electrically connected to the first metal layer, and forms a Schottky contact with the surface portion of the plurality of second JFET regions, the second portion covers the gate openings and is electrically insulated from the first portion, wherein a bottom surface of the first metal layer and a bottom surface of a part of the second metal layer are in a same second plane, and wherein the third doping concentration is greater than the second doping concentration.

13. The SiC semiconductor device of claim 12, wherein the sub-doped region is selected from a group consisted of a second p-well, a second heavily doped p-type (p+) region and the combination thereof.

14. The SiC semiconductor device of claim 12, wherein the plurality of first JFET regions having a first depth, the p-well having a second depth, the heavily doped n+ region having a third depth, the heavily doped p+ region having a fourth depth, wherein the second depth is greater than the third depth.

15. The SiC semiconductor device of claim 14, wherein the first depth is greater than or equal to the second depth.

16. The SiC semiconductor device of claim 14, wherein the first depth is greater than or equal to the fourth depth.

17. The SiC semiconductor device of claim 12, wherein the first heavily doped p+ region is surrounded by the first p-well and the heavily doped n+ region, and at least a portion of the first heavily doped p+ region overlaps with the first p-well.

18. The SiC semiconductor device of claim 12, wherein the substrate is a 4H-SiC substrate.

19. The SiC semiconductor device of claim 12, wherein the first metal layer comprising a silicide or a combination of silicides of a material selected from a group consisting of nickel, titanium, aluminum, molybdenum and niobium.

20. The SiC semiconductor device of claim 12, wherein the second metal layer is selected from a group or a combination consisting of titanium, molybdenum, nickel, aluminum, titanium silicide, molybdenum silicide, nickel silicide, aluminum silicide, titanium nitride, an aluminum copper alloy and an aluminum silicon copper alloy.

21. The SiC semiconductor device of claim 12, wherein a planar contour of the first p-well and the sub-doped region are selected from a group consisting of a square, a rectangle, a hexagon and a long stripe.

22. The SiC semiconductor device of claim 12, wherein a planar contour of the source openings is selected from a group consisting of a quadrilateral, a hexagon, an octagon, a circle and a long stripe.

23. The SiC semiconductor device of claim 12, wherein a planar contour of the junction openings is selected from a group consisting of a quadrilateral, a hexagon, an octagon, a circle and a long stripe.

* * * * *